April 25, 1967 HIROE OSAFUNE ETAL 3,316,128

SEMICONDUCTOR DEVICE

Filed Oct. 15, 1963 2 Sheets-Sheet 1

INVENTORS
HIROE OSAFUNE
TOSHIO KUROSAWA

BY Hopgood & Calimafde
ATTORNEYS

April 25, 1967 HIROE OSAFUNE ETAL 3,316,128

SEMICONDUCTOR DEVICE

Filed Oct. 15, 1963 2 Sheets-Sheet 2

INVENTORS
HIROE OSAFUNE
TOSHIO KUROSAWA
BY Hopgood & Calimafde
ATTORNEYS

Patented Apr. 25, 1967

3,316,128

SEMICONDUCTOR DEVICE

Hiroe Osafune and Toshio Kurosawa, Tokyo, Japan, assignors to Nippon Electric Company Limited, Tokyo, Japan, a corporation of Japan
Filed Oct. 15, 1963, Ser. No. 316,316
Claims priority, application Japan, Oct. 15, 1962, 37/45,812
1 Claim. (Cl. 148—33.5)

This invention relates to semiconductor devices and is particularly useful in the manufacture of such devices of extremely small size.

In the prior art, microminiature semiconductors are known which include all of the components of a given circuit in a single body of semiconductor material. These are made by several different methods which utilize impurity diffusion techniques. In the bodies or blocks of semiconductor material made in accordance with these methods, a plurality of layers of a given type conductivity are isolated or separated from each other within a wafer of different type conductivity. These methods however, have the disadvantage that a long time is required for diffusion, i.e. hundreds of hours. Moreover in these methods it is necessary to maintain considerable accuracy in the wafer thickness and furthermore the impurity concentration in this wafer must be kept to a very low value.

Accordingly, it is an object of this invention to eliminate the above disadvantages by forming semiconductor bodies of the type described by the utilization of epitaxial growth techniques.

Figure 1:
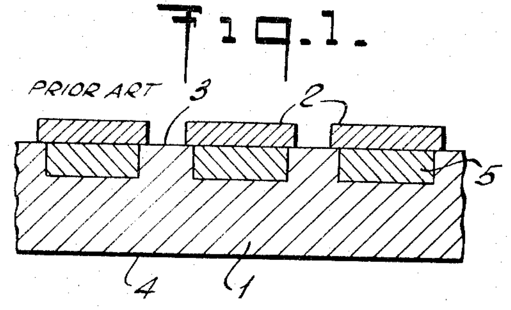
Figure 5:
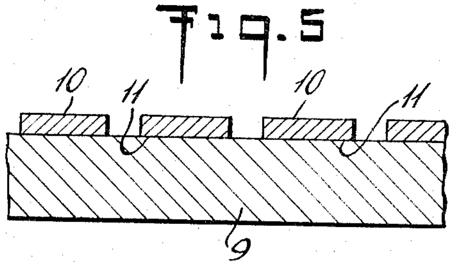
Figure 2:
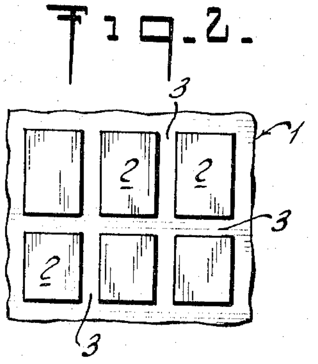
Figure 6:
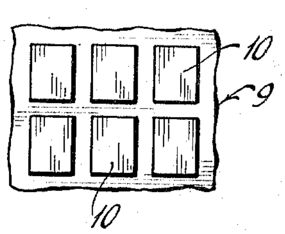
Figure 3:
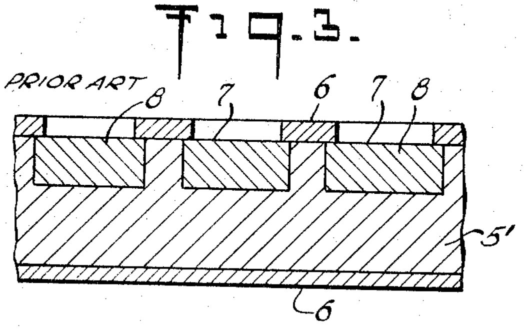
Figure 7:
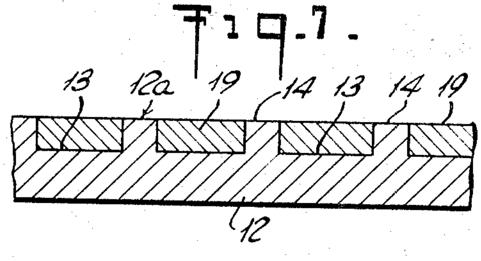
Figure 4:
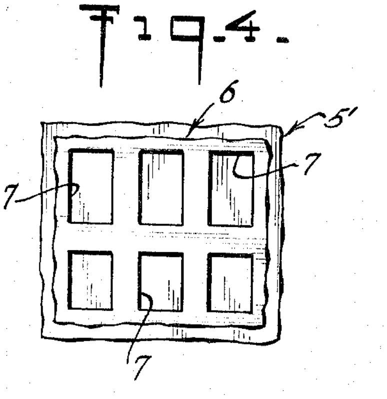
Figure 8:
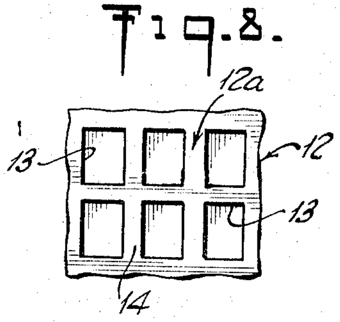
Figure 9:
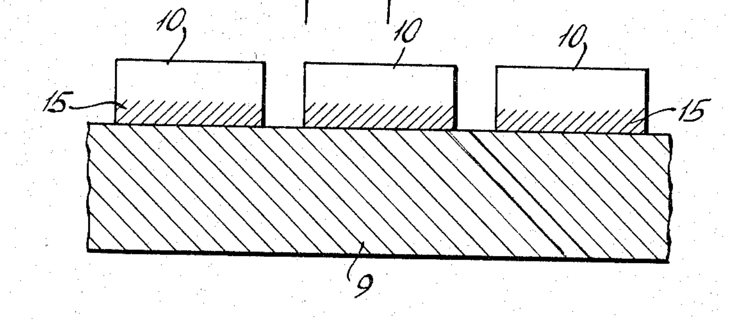
Figure 10:
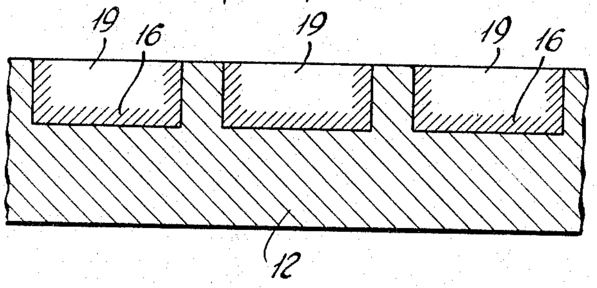
Figure 11:
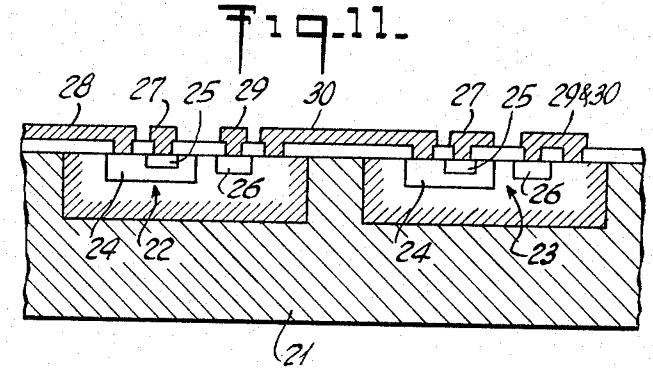

All of the objects, features and advantages of this invention and the manner of attaining them will become more apparent and the invention itself will be best understood by reference to the following description of an embodiment of the invention taken in conjunction with the accompanying drawing, in which FIGS. 1 and 2 show respectively, a sectional side view and a plan view of an example of a conventional microminiature semiconductor device constructed in accordance with known isolation diffusion techniques, FIGS. 3 and 4 show respectively, a sectional side view and a plan view of another example of a conventional semiconductor device constructed in accordance with known isolation diffusion techniques, FIGS. 5 and 6 show respectively, a sectional side view and a plan view of one example of a semiconductor wafer which embodies the principles of this invention, FIGS. 7 and 8 show respectively, a sectional side view and a plan view of another example of a semiconductor wafer constructed according to the invention, FIGS. 9 and 10 show sectional side views of still further examples of wafer constructions formed according to the present invention, and FIG. 11 illustrates the form of active and passive circuit elements within the wafer.

Referring now to FIGS. 1 and 2 there is shown a semiconductor device made in a conventional manner. To make this device, the surface of a given N-type silicon wafer 1 is coated with an oxide film 2 and then windows are selectively etched, properly masking the oxide surface, to provide exposed surfaces 3 of silicon. A P-type impurity such as boron is diffused into the wafer from both upper and lower surfaces 3 and 4, resulting in a P-type diffused layer extending from the upper surface to the lower surface. The portions under the oxide films designated as 5 however, remain as N-type and are separated from one another by P-N junctions. Active elements such as transistors or diodes and passive elements such as resistors and capacitors are provided in said N-type regions and suitably connected to obtain the final circuit desired.

FIGS. 3 and 4 show a semiconductor wafer construction made in accordance with a method different from that employed in connection with the construction of FIGS. 1 and 2. In FIGS. 3 and 4, both surfaces of a wafer 5' of P-type conductivity are coated with an oxide film 6 and the windows are selectively etched on one of the surfaces to expose silicon surfaces 7. An N-type impurity such as phosphorus is diffused into the wafer through these windows in order to form N-type layers 8 isolated from one another by P-N junctions in the P-type silicon 5'. After this, active or passive elements are provided in these N-type layers and suitably connected to obtain the final circuits desired. The conventional constructions described in FIGS. 1–4 are disadvantageous for the reasons enumerated earlier in this specification.

In FIGS. 5 and 6 there is shown one embodiment of a semiconductor wafer construction embodying the principles of this invention which overcomes the disadvantages referred to above. In FIGS. 5 and 6, the numeral 9 shows a semiconductor wafer having a given type conductivity, for example, a P-type silicon wafer. Discrete N-type regions or layers 10 are epitaxially grown on one surface of the wafer at selected places with the aid of a mask so that these N-type layers form a plurality of P-N junctions 11 separate from one another, and circuit elements are provided within these layers.

The discrete N-type regions may be formed using an oxide mask. The P-type silicon wafer is covered by an oxide film in advance, and the windows, where the circuit elements are to be made, are selectively etched in the film. An N-type layer is then epitaxially grown on the exposed surface of the silicon wafer using a conventional method. By etching the oxide film the discrete N-type regions are left.

By providing active and passive circuit elements within the N-type layers 10 of FIGS. 5 and 6 and connecting these elements in accordance with a final circuit desired, a microminiature semiconductor device having the desired characteristics is obtained. It will be noted that semiconductor wafers other than silicon may also be used and when their type of conductivity is N-type, P-type semiconductors may be epitaxially grown in a manner similar to that shown and described.

FIGS. 7 and 8 illustrate a second embodiment of the invention, in which the numeral 12 denotes a semiconductor wafer having a given type conductivity, such as P-type silicon. This wafer is provided with recesses 13 at selected positions on one surface **12*a*, and has a layer of N-type silicon 19 epitaxially grown, such as described above. This layer 19 fills the recesses 13 and initially covers the surface 12*a*. Then, by lapping or etching the layer 19 thus deposited, these N-type layers grown on the P-type portions 14 are removed to expose these portions 14 of P-type silicon which separate the filled recesses 13. With the recesses 13 thus filled with N-type silicon 19, these N-type regions or layers will be separated from one another by P–N junctions formed by the regions 14 and 19. By providing active and passive elements within these N-type layers as described below, and connecting in accordance with the final circuit, a microminiature semiconductor device having the desired characteristics may be obtained. Also in this case, the semiconductor is not limited to silicon and when the conductivity of the wafer 12 is of the N-type, P-type semiconductor regions 19** may be epitaxially grown.

A further embodiment of the invention is shown in FIGS. 9 and 10, which utilize, respectively, the basic constructions of FIGS. 5 and 7. However, in FIGS. 9 and 10, during epitaxial growth, intermediate layers, indicated by the hatched portions 15 and 16 are grown. These layers 15 and 16 are formed to have the same type of conductivity as, but an impurity concentration lower than, the adjacent upper epitaxial grown layers 10 and 19. Such constructions increase the breakdown voltage between the regions 9 and 15 and between the regions 12 and 16, as well as decrease junction capacitance, so that when the circuit components or elements are provided within the layers or regions 10 and 19, effective insulation between these elements is provided. The layers 15 and 16 may be formed by growing lightly-doped layers first and then more heavily doped layers, as desired, by increasing the doping impurity quantity.

A typical circuit in accordance with this invention is shown in FIG. 11 wherein discrete N-type regions 22 and 23 are formed in the P-type silicon wafer 21 using the method shown above. A transistor base 24 and emitter 25 and a resistor 26 are formed in the regions 22 and 23, respectively, using a conventional method. The final circuit is obtained by metallizing contacts 27, 28, 29 and 30 on the emitter 25, base 24, collector 22 and resistor 26, respectively, and an interconnection between the contacts 29 and 30, as shown.

While the foregoing description sets forth the principles of the invention in connection with specific apparatus, it is to be understood that the description is made only by way of example and not as a limitation of the scope of the invention as set forth in the objects thereof and in the accompanying claim.

What is claimed is:

An integral semiconductor structure comprising,
a wafer of given type conductivity,
discrete regions of semiconductor material of opposite type conductivity epitaxially formed at a plurality of predetermined places in said wafer,
each of said discrete regions being positioned in a different recess provided therefor generally below the outer surface of said wafer,
said wafer further having portions thereof disposed between said discrete regions, said discrete regions being separated from one another by P–N junctions,
each of said junctions being formed from one of said wafer portions and a portion of one of said discrete regions,
said discrete regions having a given amount of impurity therein,
each discrete region further including an intermediate barrier layer,
each intermediate barrier layer being formed generally below said surface of said wafer in its associated recess,
each barrier layer further being formed at the periphery of its associated discrete region and in contiguous physical relation with said wafer,
said intermediate barrier layer having the same type conductivity as said discrete regions,
and said intermediate layer further having an impurity concentration lower than that of the remaining portions of said discrete regions.

References Cited by the Examiner

UNITED STATES PATENTS

| | | | |
|---|---|---|---|
| 2,981,877 | 4/1961 | Noyce | 148—33.5 |
| 3,150,299 | 9/1964 | Noyce | 148—33 X |
| 3,158,788 | 11/1964 | Last | 148—33 X |
| 3,236,701 | 2/1966 | Lin | 148—33.5 |

OTHER REFERENCES

IBM Technical Disclosure Bulletin, volume 3, No. 12, May 1961, pages 26 and 27.

IBM Technical Disclosure Bulletin, volume 4, No. 10, March 1962, pages 58 and 59.

Proceedings of the IRE, September 1960, pages 1642 and 1643.

DAVID L. RECK, *Primary Examiner.*

C. N. LOVELL, *Assistant Examiner.*